United States Patent
Watanabe et al.

(10) Patent No.: US 10,076,745 B2
(45) Date of Patent: Sep. 18, 2018

(54) METHOD AND APPARATUS FOR PRODUCING CORE-SHELL TYPE METAL NANOPARTICLES

(71) Applicants: TOYOTA JIDOSHA KABUSHIKI KAISHA, Toyota-shi, Aichi-ken (JP); National University Corporation Nagoya University, Nagoya-shi, Aichi-ken (JP)

(72) Inventors: Masao Watanabe, Susono (JP); Mamoru Ishikiriyama, Fujieda (JP); Youhei Kinoshita, Shizuoka (JP); Nagahiro Saito, Nagoya (JP); Tomohito Sudare, Nagoya (JP)

(73) Assignees: TOYOTA JIDOSHA KABUSHIKI KAISHA, Toyota-shi, Aichi-ken (JP); NATIONAL UNIVERSITY CORPORATION NAGOYA UNIVERSITY, Nagoya-shi, Aichi-ken (JP)

( * ) Notice: Subject to any disclaimer, the term of this patent is extended or adjusted under 35 U.S.C. 154(b) by 56 days.

(21) Appl. No.: 14/614,738

(22) Filed: Feb. 5, 2015

(65) Prior Publication Data
US 2015/0224483 A1 Aug. 13, 2015

(30) Foreign Application Priority Data
Feb. 7, 2014 (JP) ................. 2014-022237

(51) Int. Cl.
*B05D 7/00* (2006.01)
*B01J 23/89* (2006.01)
(Continued)

(52) U.S. Cl.
CPC ......... *B01J 23/8926* (2013.01); *B01J 19/088* (2013.01); *B01J 35/0006* (2013.01);
(Continued)

(58) Field of Classification Search
CPC .......... B22F 1/00; B22F 9/00; B22F 2999/00; B22F 2202/00; H01L 35/00; B01J 35/00; B01J 37/00; B01J 19/00
See application file for complete search history.

(56) References Cited

U.S. PATENT DOCUMENTS 6,358,562 B1   3/2002   Vollath et al.
7,259,320 B2 * 8/2007   Take ........................ B22F 1/025
                                                     136/236.1
(Continued)

FOREIGN PATENT DOCUMENTS

CN    103008684 A    4/2013
DE    102009050120 A1    5/2010
(Continued)

OTHER PUBLICATIONS

"Synthesis and characteristics of Ag/Pt bimetallic nanocomposites by arc-discharge solution plasma processing", Panuphong Pootawang, Nagahiro Saito, Osamu Takai and Sang-Yul Lee, Nanotechnology 23 (2012) 395602 (8pp).*
(Continued)

*Primary Examiner* — David P Turocy
*Assistant Examiner* — Mohammad Mayy
(74) *Attorney, Agent, or Firm* — Sughrue Mion, PLLC (57) ABSTRACT

A method and apparatus for producing core-shell type metal nanoparticles which are excellent in productivity are provided, in particular, the present invention provides a method of production of core-shell type metal nanoparticles including (a) a step of introducing a solution of a salt of a first metal to a first flow path of a flow type reaction apparatus and applying plasma to the solution of the salt of the first metal in the first flow path to obtain a solution which contains metal nanoparticles of the first metal and (b) a step of introducing a solution of a salt of a second metal to a second flow path of the flow type reaction apparatus, making
(Continued)

it merge with the solution which contains metal nanoparticles of the first metal to obtain a mixed solution, and applying plasma to the mixed solution to cover the metal nanoparticles of the first metal by the second metal.

2 Claims, 5 Drawing Sheets

(51) Int. Cl.
| | |
|---|---|
| H01L 35/16 | (2006.01) |
| B01J 37/34 | (2006.01) |
| B01J 35/00 | (2006.01) |
| B01J 19/08 | (2006.01) |
| B22F 1/00 | (2006.01) |
| B22F 1/02 | (2006.01) |
| B22F 9/24 | (2006.01) |

(52) U.S. Cl.
CPC ......... *B01J 35/0013* (2013.01); *B01J 37/349* (2013.01); *B22F 1/0018* (2013.01); *B22F 1/025* (2013.01); *B22F 9/24* (2013.01); *H01L 35/16* (2013.01); *B01J 2219/089* (2013.01); *B01J 2219/0813* (2013.01); *B01J 2219/0894* (2013.01); *B22F 2999/00* (2013.01)

(56) References Cited

U.S. PATENT DOCUMENTS

| | | | |
|---|---|---|---|
| 2005/0129580 A1* | 6/2005 | Swinehart | B01F 5/0475 422/400 |
| 2005/0268956 A1 | 12/2005 | Take | |
| 2006/0060998 A1* | 3/2006 | Strouse | B01J 13/00 264/5 |
| 2009/0317557 A1 | 12/2009 | Luhrs et al. | |
| 2010/0105548 A1 | 4/2010 | Zhang et al. | |
| 2014/0227176 A1* | 8/2014 | Marc-Andre | A61K 49/1863 424/1.29 |

FOREIGN PATENT DOCUMENTS

| | | | |
|---|---|---|---|
| JP | 2005-294478 A | 10/2005 | |
| JP | 2008-13810 A | 1/2008 | |
| JP | 2008-246394 A | 10/2008 | |
| JP | 2011-195420 A | 10/2011 | |
| JP | 2013-108121 A | 6/2013 | |
| WO | WO 2012083442 A1 * | 6/2012 | ......... A61K 49/1863 |
| WO | 2013039117 A1 | 3/2013 | |

OTHER PUBLICATIONS

"Reduction of Lattice Thermal Conductivity in Single Bi—Te Core/Shell Nanowires with Rough Interface", Joohoon Kang, Jong Wook Roh, Wooyoung Shim, Jinhee Ham, Jin-Seo Noh, and Wooyoung Lee, Adv. Mater. 2011, 23, 3414-3419.*
Junko Hieda, et al., "Solution Plasma Surface Modification for Nanocarbon-Composite Materials", The Japan Institute of Metals, 2009, pp. 938-942, vol. 73, No. 12.
Panuphong Pootawang, et al., "Ag nanoparticle incorporation in mesoporous silica synthesized by solution plasma and their catalysis for oleic acid hydrogenation", Materials Letters, Jan. 2011, pp. 1037-1040, vol. 65.
Kim et al., "Bismuth-telluride Thermoelectric Nanoparticles Synthesized by Using a Polyol Process", Journal of the Korean Physical Society, Oct. 2010, vol. 57, No. 4, pp. 1037-1040.

* cited by examiner

METHOD AND APPARATUS FOR PRODUCING CORE-SHELL TYPE METAL NANOPARTICLES

This application claims priority from Japanese Patent Application No. 2014-022237 filed Feb. 7, 2014, the contents of all of which are incorporated herein by reference in their entirety.

TECHNICAL FIELD

The present invention relates to a method and apparatus for producing core-shell type metal nanoparticles.

BACKGROUND ART

Metal nanoparticles are utilized as not only alloy particles for sintering to produce a thermoelectric conversion material, but also as a three-way catalyst, photocatalyst, or other catalyst and other functional powder.

As the conventional method for producing metal nanoparticles which contain several types of metal, for example, there is the method of adding a reducing agent into a solution which contains several types of metal compounds so as to cause metal nanoparticles to precipitate.

For example, in the conventional method for producing Bi and Te composite metal nanoparticles for a thermoelectric conversion material, $NaBH_4$ or another reducing agent is added to a solution of $BiCl_3$, $TeCl_4$, or another metal compound to cause Bi and Te composite metal nanoparticles to precipitate.

In recent years, there has been known the so-called "solution plasma method" which generates plasma in a solution which contains a metal compound and utilizes the reducing action of plasma to cause metal nanoparticles to precipitate.

For example, PLT 1 describes a method of causing generation of plasma in a solution which contains a metal oxoacid to produce metal oxide nanoparticles. Further, PLT 2 describes a method of causing generation of plasma in an aqueous solution of a metal salt to produce metal nanoparticles of a particle size of 500 nm or less.

Further, there is known a method of producing metal nanoparticles which utilizes a flow type reaction apparatus, for example, a microreactor.

For example, PLT 3 describes a method of producing metal nanoparticles by mixing a hydrazine solution in an aqueous solution which contains a metal salt to form a hydrazine complex in a microreactor and reducing the obtained hydrazine complex by an alkali solution. Further, PLT 4 describes a method of producing metal nanoparticles by firing one or more energy beams among laser beams, electromagnetic waves, particle beams, or ultrasonic waves at a starting solution which is supplied in a microreactor.

As one form of the metal nanoparticles, core-shell type metal nanoparticles are known.

For example, PLT 5 describes utilizing the so-called "hot soap method", that is, injecting ZnO nanoparticles for forming the cores and the $CoSb_3$ precursor for forming the shells into a dispersant which is heated to a high temperature and covering the ZnO by $CoSb_3$, so as to produce core-shell type metal nanoparticles.

CITATIONS LIST

Patent Literature

PLT 1: Japanese Patent Publication No. 2011-195420A
PLT 2: Japanese Patent Publication No. 2008-013810 A
PLT 3: Japanese Patent Publication No. 2013-108121 A
PLT 4: Japanese Patent Publication No. 2008-246394 A
PLT 5: Japanese Patent Publication No. 2005-294478 A

SUMMARY OF INVENTION

Technical Problem

The present invention has as its object the provision of a method and apparatus for the production of core-shell type metal nanoparticles which are excellent in productivity and high in degree of freedom of design of the core and shell.

In this regard, in the conventional method of causing metal nanoparticles to precipitate including the addition of a reducing agent, dispersant, or other additive, sometimes impurity elements derived from such additives remain in the metal nanoparticles. Therefore, in general, it has been considered to wash or treat by pyrolysis etc. the obtained metal nanoparticles to remove the impurity elements and thereby sufficiently remove the impurity elements.

For example, in the method which is described in PLT 5, the obtained core-shell type metal nanoparticles are treated by pyrolysis to remove the impurity elements.

However, the inventors discovered that complete removal of impurity elements by washing and/or pyrolysis or other treatment was difficult and therefore there was the possibility that the core-shell type metal nanoparticles and the alloy particles obtained by alloying the same would contain slight amounts of residual impurity elements which would detract from the thermoelectric conversion characteristic of the product or the catalyst function or other characteristics.

Therefore, the present invention further has as its object the provision of core-shell type metal nanoparticles which are greatly reduced in the possibility of the thermoelectric conversion characteristic of the product or the catalyst function or other characteristics being impaired and alloy particles which are obtained by alloying these.

Solution to Problem

The inventors engaged in intensive studies and as a result came up with the following invention.

<1> A method of production of core-shell type metal nanoparticles including:
(a) a step of introducing a solution of a salt of a first metal to a first flow path of a flow type reaction apparatus and applying plasma to the solution of the salt of the first metal in the first flow path to obtain a solution which contains metal nanoparticles of the first metal and
(b) a step of introducing a solution of a salt of a second metal to a second flow path of a flow type reaction apparatus, making it merge with the solution which contains metal nanoparticles of the first metal to obtain a mixed solution, and applying plasma to the mixed solution to cover the metal nanoparticles of the first metal by the second metal.

<2> The method according to <1> wherein an oxidation reduction potential of the first metal is lower than an oxidation reduction potential of the second metal.

<3> The method according to <1> wherein the first metal is Te and the second metal is Bi or wherein the first metal is Bi and the second metal is Te.

<4> The method according to any one of <1> to <3> wherein an equivalent diameter when converting a cross-sectional area of the flow path to a circle of the same area is 1 μm to 10 mm.

<5> A flow type reaction apparatus which has a first flow path, a second flow path, and a third flow path which is formed by the first flow path and the second flow path merged together, wherein the first flow path has at least one electrode pair which generates plasma and the third flow path has at least one electrode pair which generates plasma.

<6> The flow type reaction apparatus according to <5> wherein an equivalent diameter of the flow path at the part where the plasma is applied is 1 μm to 10 mm.

<7> Core-shell type metal nanoparticles obtained by a method including:

(a) a step of introducing a solution of a salt of a first metal to a first flow path of a flow type reaction apparatus and applying plasma to the solution of the salt of the first metal in the first flow path to obtain a solution which contains metal nanoparticles of the first metal and (b) a step of introducing a solution of a salt of a second metal to a second flow path of a flow type reaction apparatus, making it merge with the solution which contains metal nanoparticles of the first metal to obtain a mixed solution, and applying plasma to the mixed solution to cover the metal nanoparticles of the first metal by the second metal.

<8> Alloy particles which are obtained by alloying the core-shell type metal nanoparticles according to <7>.

<9> A thermoelectric conversion material which is obtained by sintering core-shell type metal nanoparticles according to <7> or alloy particles according to <8>.

Advantageous Effects of Invention

According to the present invention, a method and apparatus for production of core-shell type metal nanoparticles which are excellent in productivity and which are high in freedom of design of the core and shell are provided.

Further, according to the present invention, there are provided core-shell type metal nanoparticles with an extremely low possibility of detracting from the properties of the products and alloy particles which are obtained by alloying the same.

BRIEF DESCRIPTION OF DRAWINGS

FIG. 4 shows (a) a scan transmission type electron microscope (STEM) image of Te—Bi core-shell type metal nanoparticles which are produced according to Example 1 of the present invention and (b) a graph which shows the results of analysis by energy dispersive X-ray spectrometry (EDX).

FIG. 5 shows (a) a scan transmission type electron microscope (STEM) image of Be—Te core-shell type metal nanoparticles produced according to Example 2 of the present invention and (b) a graph which shows the results of analysis by energy dispersive X-ray spectrometry (EDX).

DESCRIPTION OF EMBODIMENTS

Method of Production of Core-Shell Type Metal Nanoparticles

In the present invention, each of the core-shell type metal nanoparticles has a core and at least a single layer shell which covers the core. The core can include at least a first metal and the shell can include at least a second metal.

The method of the present invention for producing core-shell type metal nanoparticles is a method of production of core-shell type metal nanoparticles comprising (a) the step of introducing a solution of a salt of a first metal into a first flow path of a flow type reaction apparatus and applying plasma to the solution of the salt of the first metal in a first flow path to obtain a solution which contains metal nanoparticles of the first metal and (b) the step of introducing a solution of a salt of the second metal into a second flow path of a flow type reaction apparatus and making it merge with the solution containing metal nanoparticles of the first metal to obtain a mixed solution and applying plasma to the mixed solution to cover the metal nanoparticles of the first metal by the second metal.

The solution plasma method in general is the method of generating plasma in a solution which contains metal ions so as to utilize the reducing action of plasma to reduce the metal ions and make the metal nanoparticles precipitate.

The only reaction site in the solution plasma method is between the electrodes where the plasma is generated. The reaction site is small, so in general the solution plasma method is considered to be poor.

As opposed to this, the method of the present invention utilizes a flow type reaction apparatus and solution plasma method to continuously apply plasma to a starting solution to continuously produce core-shell type metal nanoparticles. Further, it may be considered to arrange the flow type reaction apparatuses of the present invention in parallel to enable a larger scale of operation.

Therefore, the method of the present invention is more excellent in productivity compared with the solution plasma method which used the batch system to produce core-shell type metal nanoparticles.

Further, the solution plasma method causes precipitation of a metal higher in oxidation reduction potential in accordance with the power of the plasma applied, that is, an easily reducing metal, with priority. For this reason, for example, if using a solution containing two or more types of metal ions and a high power plasma for causing precipitation of the metal with a lower oxidation reduction potential, that is, a not easily reducing metal, the easily reducing metal also precipitates. Therefore, if using the conventional batch type solution plasma method, making the not easily reducing metal the core and making the easily reducing metal the shell would usually be hard to believe.

As opposed to this, in the method of the present invention, not only is it possible to select an easily reducing metal as the first metal for use as the core and select a not easily reducing metal as the second metal for use as the shell, it is also possible to select a not easily reducing metal as the first metal for use as the core and an easily reducing metal as the second metal for use as the shell.

Therefore, according to the method of the present invention, it is possible to obtain the advantageous effect of a high degree of freedom of design of the core and shell.

This advantageous effect will be explained further below.

The inventors discovered that when sintering composite metal nanoparticles to obtain an alloy material, for example, a thermoelectric conversion material, sometimes the more easily vaporizing metal vaporizes away relatively more and the desired alloy composition cannot be obtained.

Specifically, the inventors discovered that, for example, when sintering composite metal nanoparticles including Bi and Te to obtain a thermoelectric conversion material, sometimes the more easily vaporizing Te vaporizes away relatively more and the desired alloy composition, for example $Bi_2Te_3$, cannot be obtained.

As a countermeasure for this, it may be considered to add more of the more easily vaporizing metal anticipating the amount of loss of the more easily vaporizing metal, but a drop in yield should be avoided. Further, the amount of vaporization of metal is not constant, so the desired alloy composition cannot be stably obtained.

Specifically, for example, when sintering composite metal nanoparticles which include Bi and Te to obtain a thermoelectric conversion material, it may be considered to add a larger amount of Te anticipating the amount of loss of the more easily vaporizing Te, but, for example, Te is expensive, so a drop in yield should be avoided. Further, even if a drop in yield were allowed, the amount of vaporization of Te would not be constant and the desired alloy composition, for example, $Bi_2Te_3$, could not be easily obtained.

As opposed to this, according to the method of the present invention, regardless of the ease of reduction of the metal, it is possible to make the easily reducing metal the core and make the not easily reducing metal the shell, so it is possible to suppress loss of the easily vaporizing metal at the time of sintering, the yield is good, and the desired alloy composition can be stably obtained.

Specifically, according to the method of the present invention, for example, when sintering the composite metal nanoparticles containing Bi and Te to obtain a thermoelectric conversion material, it is possible to make the easily reducing Te the core and make the not easily reducing Bi the shell. Therefore, it is possible to cover the easily vaporizing Te by the not easily vaporizing Bi at the time of sintering so as to suppress the loss of the easily vaporizing Te at the time of sintering, so it is possible to obtain the desired alloy composition, for example, $Bi_2\ Te_3$, stably with a good yield.

Further, the inventors discovered that, for example, when heating while sealed or heating while sealed and under pressure to sinter the metal nanoparticles and obtain any shape of alloy material, for example, a thermoelectric conversion material, a lower melting point metal melts earlier than a higher melting point metal to first flow into fine shaped parts, for example, clearances between the die and cover, and the desired alloy composition and/or uniform alloy composition cannot be obtained.

Specifically, the inventors discovered that, for example, when heating while sealed or heating while sealed and under pressure to sinter nanoparticles containing for example Bi and Te and obtain any shape of thermoelectric conversion material, the lower melting point Bi melts earlier than the higher melting point Te, so the Bi first flows into fine shaped parts, for example, clearances between the die and cover, and the desired alloy composition and/or uniform alloy composition, for example, $Bi_2Te_3$, cannot be obtained.

As opposed to this, according to the method of the present invention, regardless of the ease of reduction of the metal, it is possible to make the lower melting point metal the core and make the higher melting point metal the shell. Therefore, at the time of sintering, it is possible to first make the low melting point metal of the core melt, then making the high melting point metal of the shell melt, so it is possible to reduce the melt loss of low melting point metal and possible to stably obtain a uniform alloy composition.

Specifically, according to the method of the present invention, it is possible to make the not easily reducing Bi the core and making the easily reducing Te the shell. Therefore, it is possible to cover the lower melting point Bi with the higher melting point Te and thereby cause the core Bi to melt before, then make the shell Te melt at the time of sintering, so it is possible to reduce the melt loss of Bi and possible to stably obtain a uniform alloy composition, for example, $Bi_2Te_3$.

Regarding Process (a)

The method of the present invention for producing core-shell type metal nanoparticles introduces a solution of a salt of a first metal into a first flow path of the flow type reaction apparatus and applies plasma to the solution of the salt of the first metal in the first flow path to obtain a solution of metal nanoparticles of the first metal.

The solution of the salt of the first metal includes a salt of the first metal and a solvent and is preferably substantially comprised of a salt of the first metal and a solvent. Here, the expression of "substantially comprised of a salt of the first metal and a solvent" means that other than the salt of the first metal and solvent, no dispersant or other additive is deliberately included.

As the first metal, any metal can be used. For example, Al, Ge, Sn, Sb, Te, Pb, Bi, or other semimetals or non-transition metals (main group metals) and Ti, V, Cr, Mn, Fe, Co, Ni, Cu, Ag, Pt, Au, or other transition metals and combinations of the same may be mentioned.

As the salt of the first metal, any metal salt can be used. As the metal salt, for example, chlorates, nitrates, phosphates, sulfates, hydrofluorides, or other inorganic acid salts, carbonates, borates, silicates, chromates, or other oxolates, stearates, laureates, ricinoleates, octylates, or other carboxylates, or ammine complexes, halogeno complexes, hydroxy complexes, or other metal complexes may be mentioned.

The solvent is not particularly limited so long as it can dissolve the salt of the first metal. For example, water or an organic solvent, for example, ethanol, methanol, isopropanol, or other alcohols, heptane, hexane, nonane, and other alkanes, or benzene, toluene, xylene, or other aromatic hydrocarbons, etc. may be mentioned.

The concentration of the salt of the first metal in the solution of a salt of the first metal can be freely set based on the power of the plasma or the particle size distribution of the desired metal nanoparticles etc.

For the method of introducing the solution of the salt of the first metal into the first flow path of the flow type reaction apparatus, any method may be used. For example, pumping or transport by a cylinder etc. may be mentioned.

The flow rate (ml/min) of the solution of the salt of the first metal may be freely set based on the cross-sectional area of the first flow path or the power of the plasma applied etc. so as to obtain the particle size, particle size distribution, productivity, etc. of the desired metal nanoparticles.

As the method for applying plasma to the solution of the salt of the first metal inside the first flow path, for example, it is possible to apply voltage to at least one electrode pair which is provided at the first flow path to generate plasma between electrodes while running the first salt solution between the electrodes.

The waveform of the voltage to be applied is not particularly limited. For example, a DC voltage, AC voltage, pulse voltage, etc. may be mentioned.

The lower limit of the voltage which is applied is not particularly limited so long as it is possible to generate plasma between the electrodes. It differs depending on the particle size etc. of the desired metal nanoparticles. For example, it may be made 0.5 kV or more, preferably 1.0 kV or more.

The upper limit of the voltage which is applied can be freely set. For example, it may be made 100 kV or less, preferably 2.0 kV or less.

The lower limit of the power which is applied can be freely set based on the oxidation reduction potential of the metal which is selected. It is not particularly limited so long as the selected metal can be made to precipitate.

Here, in the present invention, the "oxidation reduction potential" means the electrode potential (V) which is determined relative to standard hydrogen electrodes.

For example, when the first metal is Bi, the oxidation reduction potential of $Bi^{3+}$ is about 0.3172V, so the lower limit of the power which is applied, for example, can be made 100 W or more, preferably 140 W or more.

Further, for example, when the first metal is Te, the oxidation reduction potential of $Te^{4+}$ is about 0.5213V, so the lower limit of the power which is applied, for example, is made 30 W or more, preferably 50 W or more.

The upper limit of the power which is applied can be freely set by the particle size etc. of the desired metal nanoparticles. For example, it is made 10 kW or less, preferably 500 W or less.

The particle size of the metal nanoparticles of the first metal can be made any particle size corresponding to the application of the core-shell type metal nanoparticles. The lower limit of the particle size can be made, for example, 0.1 nm or more, preferably 10 nm or more, while the upper limit of the particle size can be made 500 nm or less, preferably 30 nm or less.

In the present invention, the particle size can be found by observing a sample by a scan type electron microscope (SEM), transmission type electron microscope (TEM), etc., taking a photograph, directly measuring the circle equivalent particle size of the projected area based on the obtained image, and analyzing groups of particles comprised of several hundred particles or more so as to find the number average primary particle size.

Regarding Process (b)

The method of the present invention for producing core-shell type metal nanoparticles includes the process of introducing a solution of a salt of a second metal to a second flow path of the flow type reaction apparatus, making it merge with a solution containing metal nanoparticles of the first metal to obtain a mixed solution, and applying plasma to the mixed solution to cover the metal nanoparticles of the first metal by the second metal.

The solution of the salt of the second metal includes a salt of a second metal and a solvent, preferably is substantially comprised of a salt of a second metal and a solvent. Here, the expression "substantially comprised of a salt of the second metal and a solvent" means that other than the salt of the second metal and solvent, no dispersant or other additive is deliberately included.

The second metal, the salt of the second metal, the solvent, and the concentration of the salt of the second metal in the solution of a salt of a second metal can be made ones similar to the explanation of the first metal.

The introduction of the solution of the salt of the second metal to the second flow path and the flow rate can be made ones similar to the explanation of the solution of the salt of the first metal.

The first flow path and the second flow path can be merged in any way so long as mixing the solution containing nanoparticles of the first metal and the solution of the salt of the second metal so as to form a mixed solution. For example, for mixing, it is also possible to use a mixing device for promoting mixing.

Below, the flow path through which the mixed solution flows after the first flow path and the second flow path are made to merge will for convenience bee referred to as the "third flow path".

As the method of applying plasma to a mixed solution, for example, it is possible to apply voltage to the at least one electrode pair which is provided in the third flow path so as to cause plasma to be generated between the electrodes while running a mixed solution between the electrodes.

The voltage and power of the plasma at the process (b) can be made ones similar to the explanation in the process (a).

The particle size of the core-shell type metal nanoparticles can be made any particle size in accordance with the application. The lower limit of the particle size can be made, for example, 0.1 nm or more, preferably 20 nm or more, while the upper limit of the particle size can be made 500 nm or less, preferably 30 nm or less.

Flow Type Reaction Apparatus

The flow type reaction apparatus of the present invention has a first flow path, a second flow path, and a third flow path comprised of the first flow path and the second flow path merged together. Further, the first flow path has at least one electrode pair which generates plasma, and the third flow path has at least one electrode pair which generates plasma.

The "flow type reaction apparatus" generally means an apparatus which can continuously run a starting solution through the inside of a flow path, which can perform reactions and various operations such as mixing inside the flow path, and which can continuously produce a product.

In the present invention, the size of the flow type reaction apparatus is not particularly limited. For example, when converting the cross-sectional area of the flow path to a circle of the same area, as the upper limit of the equivalent diameter of the flow path, for example, 10 mm or less, preferably 3 mm or less, may be mentioned. In particular, when the upper limit of the equivalent diameter of the flow path at the part where plasma is applied is for example 10 mm or less, preferably 1 mm or less, it is possible to apply plasma more uniformly to the running solution.

As the lower limit of the equivalent diameter of the flow path, for example, 1 μm or more, preferably 100 μm or more is mentioned.

The flow type reaction apparatus is not particularly limited. For example, in general, one called a "microreactor" may be mentioned.

For the electrode pairs, it is possible to use any electrodes so long as application of voltage enables generation of plasma. As the material of the electrode pairs, for example, tungsten, copper, chromium, graphite, etc. may be mentioned.

For details of the rest of the configuration, refer to the explanation of the method of the present invention for producing core-shell type metal nanoparticles.

Core-Shell Type Metal Nanoparticles

The core-shell type metal nanoparticles of the present invention are core-shell type metal nanoparticles which are obtained by a method including (a) a step of introducing a solution of a salt of a first metal to a first flow path of a flow type reaction apparatus and applying plasma to the solution of the salt of the first metal in the first flow path to obtain a solution which contains metal nanoparticles of the first metal and (b) a step of introducing a solution of a salt of a second metal to a second flow path of the flow type reaction apparatus, making it merge with the solution which contains metal nanoparticles of the first metal to obtain a mixed solution, and applying plasma to the mixed solution to cover the metal nanoparticles of the first metal by the second metal.

According to the core-shell type metal nanoparticles of the present invention, it is possible to produce extremely high purity products, for example, catalysts or thermoelectric conversion materials etc., so it is possible to obtain products which have high characteristics, for example, high catalyst functions or high thermoelectric conversion characteristics.

Impurity Elements

In the present invention, the "impurity elements which are contained in the core-shell type metal nanoparticles" indicate elements which are not deliberately included in the composition of the core-shell type metal nanoparticles. Therefore, the elements due to the additives which are deliberately included in the final core-shell type metal nanoparticles are not deemed impurity elements.

The impurity elements are not particularly limited. For example, alkali metals, alkali earth metals, transition metals, or other metals, boron, aluminum, silicon, or other base metals or semimetals, carbon, nitrogen, phosphorus, sulfur, or other nonmetals due to the reducing agent and/or dispersant may be mentioned.

Alloy Particles

The alloy particles of the present invention are alloy particles which are obtained by alloying the core-shell type metal nanoparticles of the present invention.

According to the alloy particles of the present invention, it is possible to produce extremely high purity products, for example, catalysts or thermoelectric conversion materials etc., so it is possible to obtain products which have high characteristics, for example, high catalyst functions or high thermoelectric conversion characteristics.

While not theoretically limited, conceivably, along with the growth of the alloy particles due to alloying, Na and other impurity elements are driven out from the metal nanoparticles and the above such concentration of impurity elements can be reached.

The method of alloying can be performed by any method. For example, hydrothermal synthesis or other heat treatment may be mentioned.

The hydrothermal synthesis can be performed by any method. For example, it is possible to fill an autoclave or other sealed container with core-shell type nanoparticles and water and heat them while sealing the container.

The temperature of the alloying can be freely set as long as alloying at least part of the core-shell type metal nanoparticles.

For example, in the case of core-shell type nanoparticles which include Bi and Te, as the lower limit, for example, 150° C. or more, preferably 250° C. or more, may be set, while as the upper limit, for example, 400° C. or less, preferably 300° C. or less, may be set.

Thermoelectric Conversion Material

The thermoelectric conversion material of the present invention is a thermoelectric conversion material which is obtained by sintering the core-shell type metal nanoparticles of the present invention or the alloy particles of the present invention.

According to the thermoelectric conversion material of the present invention, it is possible to greatly reduce the possibility of the thermoelectric conversion characteristic being damaged due to impurity elements which had been considered sufficiently removed in the past, so a high thermoelectric conversion performance can be obtained.

The method of bonding may be any method. For example, it is possible to shape the core-shell type metal nanoparticles or alloy particles in advance by press forming or place them freely in a mold and heat them in a sintering furnace.

The temperature of the sintering can be freely set so long as a temperature which enables the particles to be bonded with each other and which allows for scattering of the component elements.

For example, in the case of core-shell type metal nanoparticles or alloy particles which contain Bi and Te, the lower limit of the temperature of sintering can, for example, be made 300° C. or more, preferably 400° C. or more, while the upper limit can be made 550° C. or less, preferably 450° C. or less.

The sintering can be performed in the air and can optionally be performed in nitrogen or argon or another inert gas.

At the time of sintering, it is optionally possible to apply pressure to promote the sintering.

EXAMPLES

Below, the present invention will be explained more specifically, but the present invention is not limited to the examples described below.

Example 1

In Example 1, Te—Bi core-shell type metal nanoparticles having Te as cores and having Bi as shells were prepared. These were alloyed to prepare $Bi_2Te_3$ alloy particles. Further, the $Bi_2Te_3$ alloy particles were sintered to prepare a $Bi_2Te_3$ thermoelectric conversion material.

Figure 1:
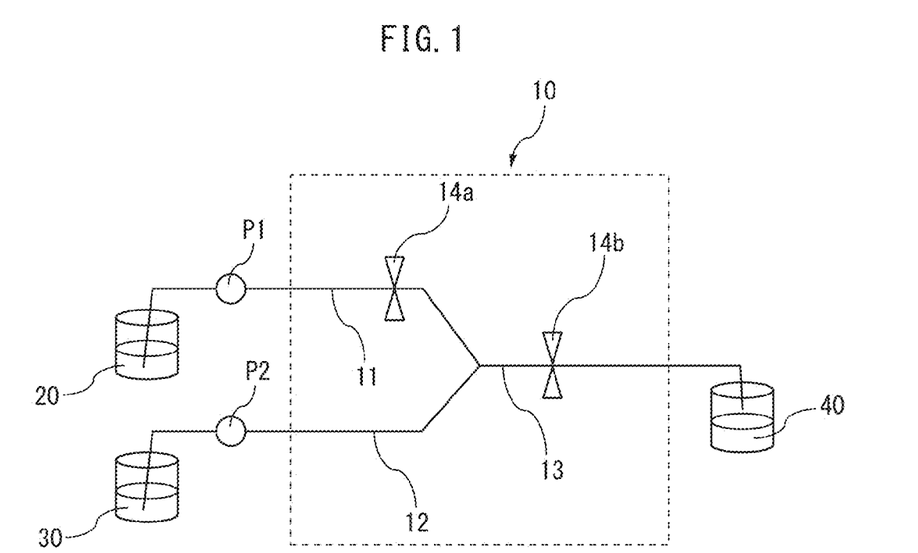
FIG. 1 is a schematic view which shows illustrative embodiments of the method of the present invention for production of core-shell type metal nanoparticles and the flow type reaction apparatus of the present invention.

FIG. 1 is a schematic view which shows an illustrative embodiment of the method of the present invention for producing core-shell type metal nanoparticles and a flow type reaction apparatus of the present invention.

As the first metal salt solution (20), a solution of 100 ml of an ethanol solvent in which 0.214 g of $TeCl_4$ is contained was used.

As the second metal salt solution (30), a solution of 100 ml of an ethanol solvent in which 0.170 g of $BiCl_3$ is contained was used.

In the procedure (a), as shown in FIG. 1, the first metal salt solution (20) is introduced using the pump (P1) to the first flow path (11) of the flow type reaction apparatus (10) at 10 ml/min.

1.5 kV of voltage was applied to a tungsten electrode pair (14a) which was provided in the first flow path (10) by 50 W of power to generate plasma between the electrodes while the solution of the salt of the first metal (20) was run through them so as to thereby apply plasma. Due to this, a solution containing core-use Te metal nanoparticles was obtained.

In the procedure (b), as shown in FIG. 1, the second metal salt solution (30) was introduced using the pump (P2) to the second flow path (12) of the flow type reaction apparatus (10) at 10 ml/min and made to merge with the solution containing the Te metal nanoparticles to obtain a mixed solution. The flow rate of the mixed solution at the third flow path (13) was 20 ml/min.

1.5 kV of voltage was applied to a tungsten electrode pair (14b) which was provided in the third flow path (13) by 140 W of power to generate plasma between the electrodes while the mixed solution was run through them so as to thereby apply plasma to the mixed solution. Due to this, the core-use Te metal nanoparticles were covered by Bi and a solution (40) containing Te—Bi core-shell type metal nanoparticles was obtained at a rate of 20 ml/min in an amount of 200 ml.

The obtained solution was filtered to take out Te—Bi core-shell type metal nanoparticles which were then washed by ethanol, washed by water, again washed by ethanol, and further dried to thereby prepare Te—Bi core-shell type metal nanoparticles in about 12 g.

The obtained Te—Bi type metal nanoparticles were alloyed at 270° C. for 10 hours by hydrothermal synthesis to obtain an aqueous solution which contains $Bi_2 Te_3$ alloy particles. The obtained aqueous solution was filtered to take out $Bi_2 Te_3$ alloy particles which were then washed by ethanol, washed by water, again washed by ethanol, and further dried to thereby prepare $Bi_2 Te_3$ alloy particles.

Finally, the obtained $Bi_2Te_3$ alloy particles were sintered in an Ar atmosphere at 400° C. to prepare a sintered body of a $Bi_2 Te_3$ thermoelectric conversion material.

Example 2

In Example 2, as the solution of the salt of the first metal (20), a solution comprising 100 ml of ethanol solvent in which 0.170 g of $BiCl_3$ is included was used. As the salt solution (30) of the second metal, a solution comprised of 100 ml of ethanol solvent in which 0.214 g of $TeCl_4$ is contained was used.

Further, in Example 2, except for making the power of the plasma in procedure (a) 140 W and making the power of the plasma in procedure (b) 50 W the same procedure was followed as in Example 1 to prepare Bi—Te core-shell type metal nanoparticles in an amount of about 12 g.

Reference Example 1

In Reference Example 1, the batch type solution plasma method was used by the following procedure to prepare Te—Bi core-shell type metal nanoparticles.

Figure 2:
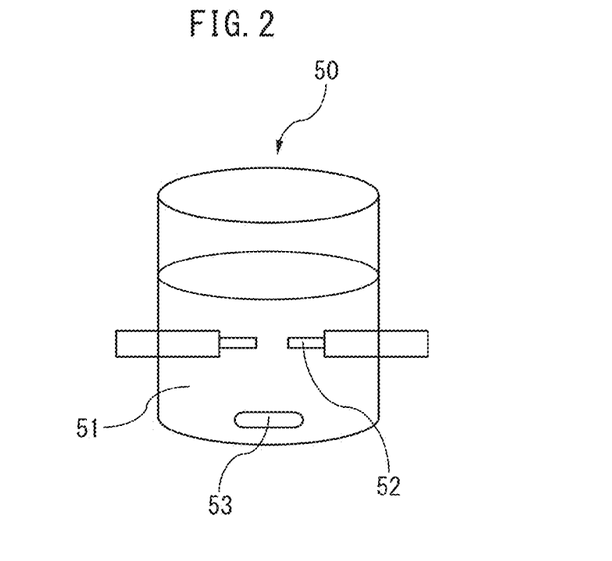
FIG. 2 is a schematic view which shows a method of Reference Example 1 for production of core-shell type metal nanoparticles.

In Reference Example 1, as shown in FIG. 2, as the starting solution (51), a solution comprised of 200 ml of ethanol solvent in which 0.170 g of $BiCl_3$ and 0.214 g of $TeCl_4$ are contained was used.

A batch type reaction apparatus (50) was filled with the starting solution (51) which was stirred by a stirrer (53) while applying 1.5 kV of voltage to a tungsten electrode pair (52) by 50 W power to cause the generation of plasma between electrodes and thereby apply plasma to the starting solution (51). Due to this, the more easily reducing Te first started to precipitate.

While continuously stirring and applying plasma at 50 W, the transmittance of the solution, which falls along with growth of the Te nanoparticles, was tracked by a visible ultraviolet spectrophotometer (UV-vis). When the transmittance of the solution fell 3% from the initial transmittance before application of the plasma, the power was switched to 140 W and the not easily reducing Bi was made to precipitate on the Te nanoparticles. The time during which the plasma was switched was about 30 minutes from the start of application of the plasma.

While continuously stirring and applying plasma at 140 W, the transmittance of the solution, which falls along with growth of the Bi shell, was tracked by a visible ultraviolet spectrophotometer (UV-vis). When the transmittance of the solution fell 25% from the initial transmittance before application of the plasma, the application of plasma was stopped. The time during which the plasma was stopped was about 100 minutes from the start of application of the plasma.

The obtained solution was filtered to take out Te—Bi core-shell type metal nanoparticles which were then washed by ethanol, washed by water, again washed by ethanol, and further dried to thereby prepare Te—Bi core-shell type metal nanoparticles in an amount of about 12 g.

Comparative Example

In the comparative example, a reducing agent constituted by $NaBH_4$ was used to prepare Bi and Te composite metal nanoparticles, these were alloyed to prepare $Bi_2Te_3$ alloy particles, and, further, these were sintered to prepare a $Bi_2Te_3$ thermoelectric conversion material.

As the starting solution, a solution comprising 100 ml of ethanol in which 0.170 g of $BiCl_3$ and 0.214 g of $TeCl_4$ were contained was used. As the reducing agent, a reducing agent solution comprised of 100 ml of ethanol in which 0.218 g of $NaBH_4$ was contained was used The container was charged with the starting solution which was stirred while adding a reducing agent solution containing $NaBH_4$ to cause Bi and Te composite metal nanoparticles to precipitate.

The obtained solution was filtered to take out Bi and Te composite metal nanoparticles which were then washed by ethanol, washed by water, again washed by ethanol, and furthermore dried to prepare Bi and Te composite metal nanoparticles.

The obtained Bi and Te composite metal nanoparticles were alloyed by hydrothermal synthesis at 270° C. for 10 hours to obtain an aqueous solution which contains $Bi_2Te_3$ alloy particles.

The obtained aqueous solution was filtered to take out $Bi_2Te_3$ alloy particles which were then washed by ethanol, washed by water, again washed by ethanol, and further dried to thereby prepare $Bi_2Te_3$ alloy particles.

Finally, the obtained $Bi_2 Te_3$ alloy particles were sintered in an Ar atmosphere at 400° C. to obtain a sintered body of a $Bi_2 Te_3$ thermoelectric conversion material.

EVALUATION

Figure 3:
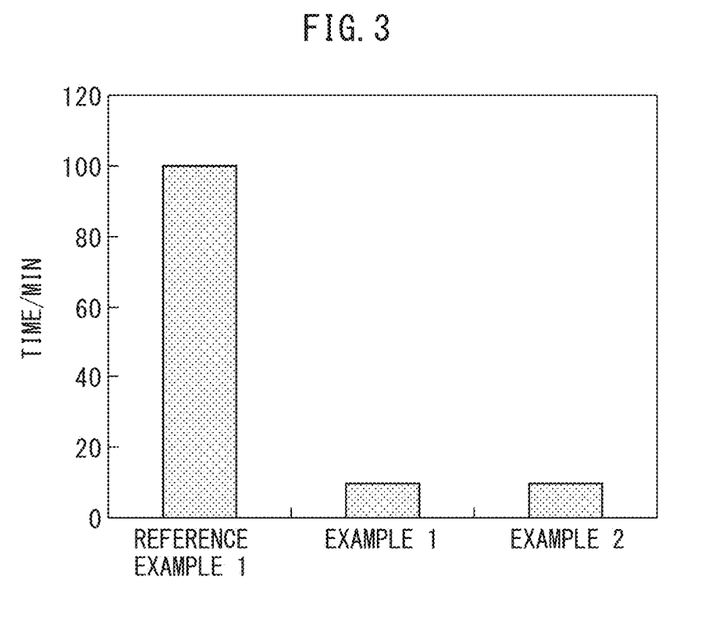
FIG. 3 is a graph which shows the time which is required until obtaining 12 g of core-shell type metal nanoparticles of Examples 1 and 2 and Reference Example 1.

As shown in FIG. 3, in Examples 1 and 2, it was possible to obtain a solution containing core-shell type metal nanoparticles in an amount of 200 ml in 10 minutes and possible to obtain 12 g of core-shell type metal nanoparticles from this solution. As opposed to this, in Reference Example 1, about 100 minutes were required for causing the precipitation of the same amount of 12 g core-shell type metal nanoparticles. From these results, it will be understood that the method and apparatus of the present invention are excellent in productivity.

A STEM image of the Te—Bi core-shell type metal nanoparticles which were obtained in Example 1 is shown in FIG. 4(a), while the results of EDX analysis along the white line of FIG. 4(a) are shown in FIG. 4(b). A STEM image of the Bi—Ti core-shell type metal nanoparticles which were obtained in Example 2 is shown in FIG. 5(a), while the results of EDX analysis along the white line of FIG. 5(a) are shown in FIG. 5(b).

Figure 4:
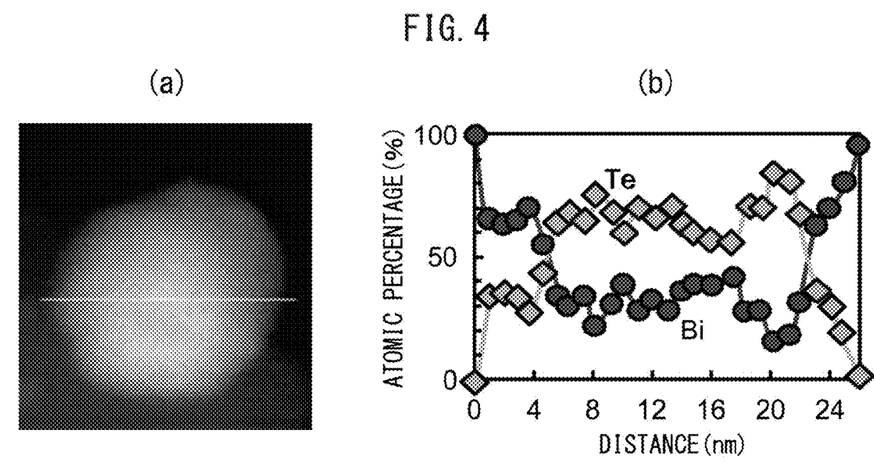
Figure 5:
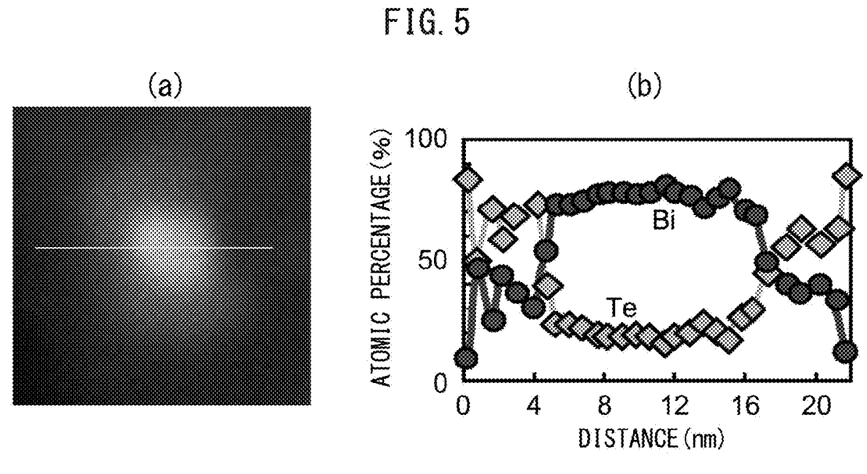

As shown in FIG. 4 and FIG. 5, according to the method of the present invention, either of Bi and Te can be made the core or can be made the shell. As opposed to this, with the method according to Reference Example 1, if high power is used from the start, both Bi and Te end up precipitating, so Bi cannot be made the core. Therefore, it will be understood that the method and apparatus of the present invention are high in degree of freedom of design of the core and shell.

Figure 6:
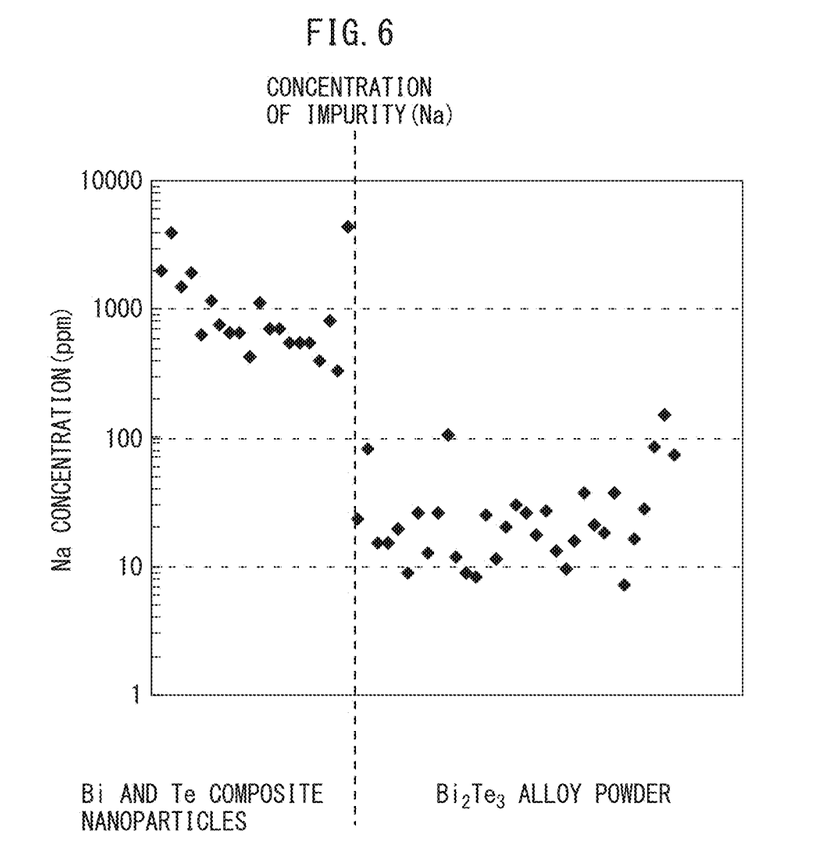
FIG. 6 is a graph which shows the concentration (ppm) of Na as an impurity element which is contained in the composite metal nanoparticles of Te and Bi and in their alloy particles of the comparative example.

The left side of the graph of FIG. 6 from the broken line shows the concentration (ppm) of Na as an impurity element contained in the Te and Bi composite metal nanoparticles which are produced in the comparative example. The right side of the graph of FIG. 6 from the broken line shows the concentration (ppm) of Na as an impurity element contained in the alloy particles which are obtained by alloying the Te and Bi composite metal nanoparticles which are produced in the comparative example.

As shown in FIG. 6, from the Te and Bi composite metal nanoparticles of the comparative example, over 300 to 4000 ppm of Na was detected as an impurity element. From these alloy particles, over 5 ppm to 200 ppm of Na was detected as an impurity element. As opposed to this, the core-shell type nanoparticles which were produced in Example 1 do not use any reducing agent, dispersant, or other additive, so no Na is detected as an impurity element.

Reference Examples 2 and 3

In the above examples, examples of core-shell type metal nanoparticles including Bi and Te which are used for preparation of a thermoelectric conversion material were described, but the present invention is not limited to these. A person skilled in the art could refer to the disclosures up to here and the descriptions of the following reference examples to use a salt of another metal as the salt of the first metal or the salt of the second metal.

Reference Example 2

The batch type solution plasma method was used by the following procedure to prepare Au—Cu core-shell type nanoparticles which are useful as catalyst metal.

As the starting solution, a solution of 200 ml of ethanol solvent including 1.2 mmol of tetrachloroauric (III) acid ($HAuCl_4 \cdot 4H_2O$), 4.8 mmol of copper acetate (II) ($Cu(CH_3COO)_2 \cdot H_2O$), and 5 mmol of NaI was used.

A method similar to Reference Example 1 was used to prepare Au—Cu core-shell type nanoparticles by an applied voltage of 1.5 kV while switching the power of the plasma from 50 W to 140 W.

Figure 7:
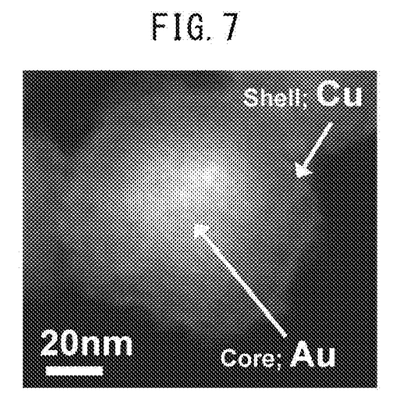
FIG. 7 is a transmission type electron microscope (TEM) image of Au—Cu core-shell type metal nanoparticles which are produced according to Reference Example 2.

FIG. 7 shows a TEM image of the obtained metal nanoparticles. It is understood that Au—Cu core-shell type metal nanoparticles were formed.

Reference Example 3

The batch type solution plasma method was used by the following procedure to prepare Au—Co core-shell type nanoparticles which are useful as catalyst metal.

As the starting solution, a solution of 200 ml of ethanol solvent including 1.2 mmol of tetrachloroauric (III) acid ($HAuCl_4 \cdot 4H_2O$), 4.8 mmol of cobalt acetate (II) ($Co(CH_3COO)_2 \cdot 4H_2O$), and 5 mmol of NaI was used.

A method similar to Reference Example 1 was used to prepare Au—Co core-shell type nanoparticles by an applied voltage of 1.5 kV while switching the power of the plasma from 50 W to 140 W.

Figure 8:
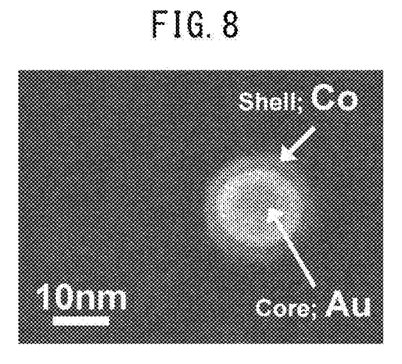
FIG. 8 is a transmission type electron microscope (TEM) image of Au—Co core-shell type metal nanoparticles which are produced according to Reference Example 3.

FIG. 8 shows a TEM image of the obtained metal nanoparticles. It is understood that Au—Co core-shell type metal nanoparticles were formed.

A person skilled in the art could work the present invention from the fact that Reference Example 1 and Example 1 both can produce Te—Bi core-shell type metal nanoparticles and from the description of Reference Example 2 by making a solvent comprised of ethanol containing tetrachloroauric (III) acid ($HAuCl_4 \cdot 4H_2O$) the solution of the salt of the first metal and making a solution of ethanol containing copper acetate (II) ($Cu(CH_3COO)_2 \cdot H_2O$) the solution of the salt of the second metal. In the same way, a person skilled in the art could work the present invention from the description of Reference Example 3 by making a solvent comprised of ethanol containing tetrachloroauric (III) acid ($HAuCl_4 \cdot 4H_2O$) the solution of the salt of the first metal and making a solution of ethanol containing cobalt acetate (II) ($Co(CH_3COO)_2 \cdot 4H_2O$) the solution of the salt of the second metal.

REFERENCE SIGNS LIST 10 flow type reaction apparatus
11 first flow path
12 second flow path
13 third flow path
14a, 14b electrode pair
20 solution of salt of first metal
30 solution of salt of second metal
40 solution containing core-shell type metal nanoparticles
50 batch type reaction apparatus
51 starting solution
52 electrode pair
53 stirrer

The invention claimed is:

1. A method of production of a thermoelectric conversion material comprising:
   (a) a step of introducing a solution of a salt of Bi to a first flow path of a flow type reaction apparatus and applying plasma to the solution of the salt of Bi in the first flow path to obtain a solution which contains metal nanoparticles of Bi and
   (b) a step of introducing a solution of a salt of Te to a second flow path of the flow type reaction apparatus, making it merge with the solution which contains metal nanoparticles of Bi at a third flow path to obtain a mixed solution, and applying plasma to the mixed solution in the third flow path to cover the metal nanoparticles of Bi by Te to obtain Bi—Te core-shell type metal particles,
   (c) a step of sintering the Bi—Te core-shell type metal particles by heating while sealed or heating while sealed and under pressure,
   wherein a power of plasma applied in the first flow path is set to 100 W or more and 10 kW or less to precipitate Bi and a power of plasma applied in the third flow path is set to 30 W or more and 10 kW or less to precipitate Te.

2. The method according to claim 1 wherein an equivalent diameter when converting cross-sectional areas of the first flow path and the third flow path to a circle of the same area are respectively 1 μm to 10 mm.

* * * * *